US006812521B1

(12) United States Patent
He et al.

(10) Patent No.: US 6,812,521 B1
(45) Date of Patent: Nov. 2, 2004

(54) METHOD AND APPARATUS FOR IMPROVED PERFORMANCE OF FLASH MEMORY CELL DEVICES

(75) Inventors: Yuesong He, San Jose, CA (US); Kent Kuohua Chang, Cupertino, CA (US); R. Lee Tan, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/492,243

(22) Filed: Jan. 27, 2000

Related U.S. Application Data
(60) Provisional application No. 60/165,882, filed on Nov. 16, 1999.

(51) Int. Cl.[7] ............................................. H01L 29/76
(52) U.S. Cl. ..................... 257/319; 257/315; 257/316; 257/317; 257/318; 257/314; 257/319; 438/286; 438/288; 438/303; 438/305
(58) Field of Search ............................ 257/314, 315, 257/318, 319, 317, 316; 438/303, 305, 286, 288

(56) References Cited

U.S. PATENT DOCUMENTS

| | | | | |
|---|---|---|---|---|
| 4,578,128 A | * | 3/1986 | Mundt et al. ................ | 148/191 |
| 5,045,898 A | | 9/1991 | Chen et al. .............. | 357/23.11 |
| 5,091,332 A | | 2/1992 | Bohr et al. .................... | 437/69 |
| 5,122,474 A | | 6/1992 | Harrington, III ............. | 437/44 |
| 5,395,773 A | * | 3/1995 | Ravindhran et al. ........... | 437/27 |
| 5,464,998 A | * | 11/1995 | Hayakawa et al. ......... | 257/316 |
| 5,547,882 A | * | 8/1996 | Juang et al. ................... | 437/40 |
| 5,712,501 A | * | 1/1998 | Davies et al. ................ | 257/335 |
| 5,851,886 A | * | 12/1998 | Peng ........................... | 438/289 |
| 5,877,049 A | | 3/1999 | Liu et al. ..................... | 438/224 |
| 5,894,146 A | * | 4/1999 | Pio et al. ..................... | 257/319 |
| 5,989,963 A | * | 11/1999 | Luning et al. .............. | 438/289 |
| 6,008,094 A | * | 12/1999 | Krivokapic et al. ......... | 438/286 |
| 6,018,178 A | * | 1/2000 | Sung ........................... | 257/316 |

(List continued on next page.)

OTHER PUBLICATIONS

Yang, Edward S., "Microelectronic Devices", McGraw–Hill Book Company, 1998, pp. 305–311.

*Primary Examiner*—Allan R. Wilson
*Assistant Examiner*—Edgardo Ortiz
(74) *Attorney, Agent, or Firm*—Farjami & Farjami LLP

(57) ABSTRACT

Dopant of an n-type is deposited in the channel area of a p-type well of isolated gate floating gate NMOS transistors forming the memory cells of a memory device array connected in a NAND gate architecture. The dopant is provided by a tilt angle around the existing floating gate/control gate structure at the stage of the fabrication process where the floating gate/control structure is in existence, the field oxidation step may also have occurred, and implantation of the source and drain dopants may also have occurred. This forms a retrograde n-type distribution away from the direction of the surface of the substrate in the channel, which is also concentrated laterally toward the centerline axis of the gate structure and decreases towards the opposing source and drain regions. This deposition promotes buried-channel-like performance of the NMOS transistors connected in series in the NAND gate memory architecture. This reduces series resistance of the series-connected floating gate MOS devices, allowing the desired reduction in source/drain dopant levels in order to combat short channel effects.

6 Claims, 1 Drawing Sheet

U.S. PATENT DOCUMENTS

| | | | |
|---|---|---|---|
| 6,093,951 A | * 7/2000 | Burr | 257/408 |
| 6,150,698 A | * 11/2000 | Ohtsuka et al. | 257/371 |
| 6,156,615 A | * 12/2000 | Kepler | 438/305 |
| 6,162,693 A | * 12/2000 | Wang et al. | 438/303 |
| 6,180,468 B1 | * 1/2001 | Yu et al. | 438/297 |
| 6,187,643 B1 | * 2/2001 | Borland | 438/302 |
| 6,207,990 B1 | * 3/2001 | Pio | 257/314 |
| 6,221,724 B1 | * 4/2001 | Yu et al. | 438/289 |
| 6,229,177 B1 | * 5/2001 | Yeap et al. | 257/327 |
| 6,245,649 B1 | * 6/2001 | Buller et al. | 438/514 |
| 6,255,693 B1 | * 7/2001 | Prall et al. | 257/349 |
| 6,271,550 B1 | * 8/2001 | Gehrmann | 257/285 |
| 6,365,475 B1 | * 4/2002 | Cheng et al. | 438/306 |
| 6,383,876 B1 | * 5/2002 | Son et al. | 438/289 |

* cited by examiner

METHOD AND APPARATUS FOR IMPROVED PERFORMANCE OF FLASH MEMORY CELL DEVICES

This application claims the benefit of Provisional application Ser. No. 60/165,882, filed Nov. 16, 1999.

FIELD OF THE INVENTION

The present invention relates to flash memory or EEPROM memory cells using isolated gate floating gates.

BACKGROUND OF THE INVENTION

Flash memory cell arrays using isolated gate floating gate MOSFET transistors store charge on the floating gates which modify the threshold voltage ("$V_t$") of the MOSFETs of the memory cells. These memory cells can be arranged in a NAND gate or NOR gate architecture for purposes of reading and writing the respective cells in the array.

To achieve higher density, the feature size of these cells is currently at a low sub-micron level. As the channels of these transistors become shorter, a number of detrimental short channel effects are seen. One solution to avoid these effects, such as "punch-through", is to reduce the dopant levels of the source and drain of the MOS devices. Reducing source and drain dopant levels, however, cause an increase in the series resistance of a memory cell device, thus reducing the read current to an unacceptably low level.

There is thus a need for a method and an apparatus that maintain a sufficiently high read current in a floating gate MOSFET transistor, even with a reduced source and drain dopant levels. In the past, retrograde doping distribution are created by ion implantation and subsequent annealing to modify the underlying p-type or n-type well dopant concentration. Such a process is described in Yang, Microelectronic Devices, McGraw-Hill, 1988, and U.S. Pat. No. 5,045,898, issued to Chen et al. on Aug. 30, 1991, entitled CMOS INTEGRATED CIRCUIT HAVING IMPROVED ISOLATION, and U.S. Pat. No. 5,091,332, issued to Bohr et al. on Feb. 25, 1992, entitled SEMICONDUCTOR FIELD OXIDATION PROCESS, the disclosures of which are hereby incorporated by reference. Retrograde dopant distribution in the channel region has also been used to create buried n-channel devices (PMOS) to deal with short channel effects, as is shown in U.S. Pat. No. 5,122,474, issued to Harrington III on Jun. 16, 1992, entitled METHOD OF FABRICATING A CMOS IC WITH REDUCED SUSCEPTIBILITY TO PMOS PUNCHTHROUGH, the disclosure of which is hereby incorporated by reference.

Other methods addressing punch-through and other short-channel effects have included buried back gates, as shown in U.S. Pat. No. 5,877,049, issued to Liu et al. on Mar. 2, 1999, entitled METHOD FOR FORMING ADVANCED TRANSISTOR STRUCTURES WITH OPTIMUM SHORT CHANNEL CONTROLS FOR HIGH DENSITY HIGH PERFORMANCE INTEGRATED CIRCUITS, the disclosure of which is hereby incorporated by reference.

SUMMARY OF THE INVENTION

The present invention relates to providing dopant in the channel area of a well structure for NAND type memory cells formed by isolated gate floating gate transistors. The dopant is provided by ion implantation with a tilt angle around the existing floating gate structure at a selected stage of the fabrication process following the formation of the control/floating gate structure. The process of the present invention may occur before or after the implantation of the source and drain dopants. The tilt angle implantation forms a retrograde distribution from the channel surface, which is also concentrated laterally toward the centerline axis of the gate structure and decreases towards the opposing source and drain regions. This retrograde distribution promotes buried-channel-like performance of the transistors connected in series in the NAND gate memory architecture and reduces series resistance of the series-connected floating gate MOS devices. Consequently, a reduction in source/drain dopant levels is achieved. Decreasing the series resistance in the bit line provides higher the output current that is available for sensing for a given selected $V_{cc}$.

BRIEF DESCRIPTION OF THE DRAWING

The use of similar reference numerals in different Figures indicates similar or identical items.

DETAILED DESCRIPTION OF A PREFERRED EMBODIMENT

Figure 1:
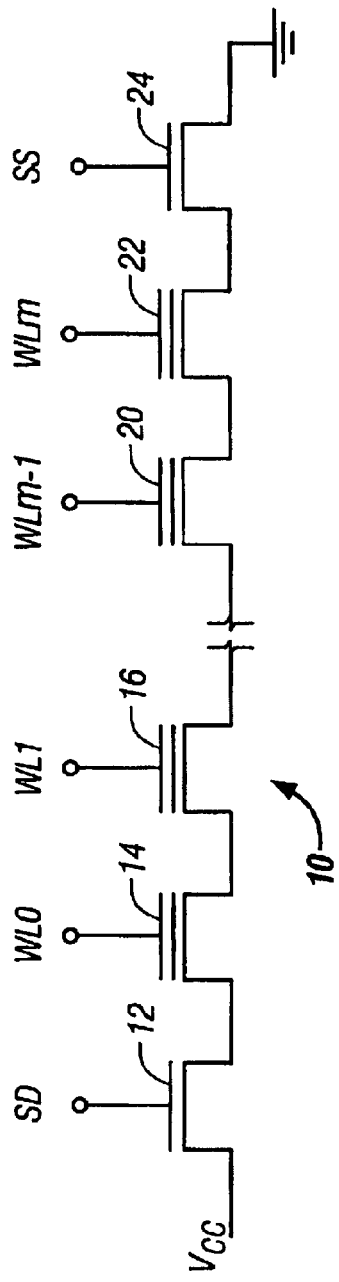
FIG. 1 shows a schematic diagram of a portion of a basic flash memory cell arrangement in a NAND gate architecture; and, FIG. 2 shows a cross-sectional view of the isolated gate floating gate NMOS transistors forming the NAND gate architecture shown in FIG. 1, at an intermediate stage of manufacture.

FIG. 1 shows a schematic view of a portion of a basic flash memory cell arrangement 10 in a NAND gate architecture. Arrangement 10 includes isolated gate floating gate MOSFET transistors 14, 16, 20 and 22 connected together in series by common source/drain leads along a bit line of a memory cell array (not shown).

In the NAND gate architecture, a number of memory transistors ("cells"), usually a multiple of 8, are connected along a "bit line" of a memory array. Each of transistors 14, 16, 20 and 22 is associated respectively with a word line. For example, the gate of transistor 14 is connected to WL0, the gate of transistor 16 is connected to WL1, the gate of transistor 20 is connected to WLn-1, and the gate of transistor 22 is connected to WLn.

As shown in FIG. 1, the drain of transistor 14 is connected to the source of an insulated gate NMOS selection transistor 12. The drain of transistor 12 is connected to a voltage source $V_{cc}$ and the gate of transistor 12 is connected to receive a signal SD. At the opposite end of arrangement 10 is provided another insulated gate NMOS selection transistor 24. The drain of transistor 24 is connected to the source of transistor 22 and the source of transistor 24 is connected to ground. The gate of transistor 24 is connected to the source of a signal SS. Together transistors 12 and 24 select for reading the stored content of one of memory transistors 14, 16, 20, 22 when an associated one of the word lines WL0-WLn is selected.

Figure 2:
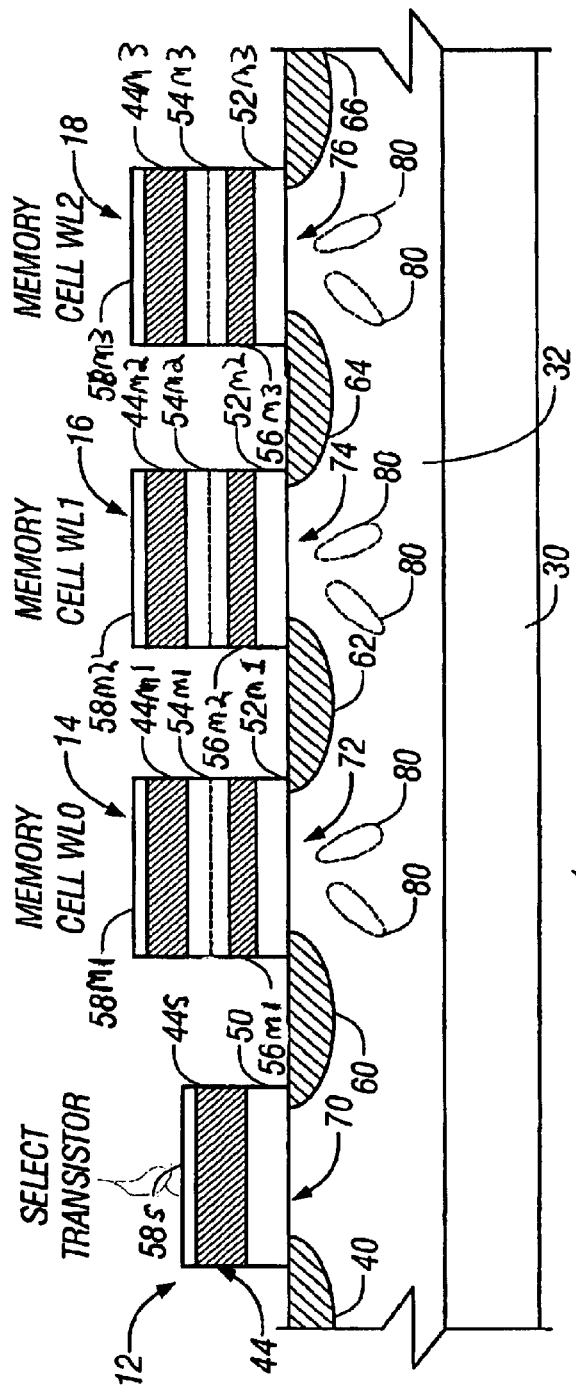

FIG. 2 shows a cross sectional view of a plurality of memory cells of arrangement 10 at an intermediate stage of manufacture. NMOS transistors 12, 14, 16 and 18 are depicted as being formed in a p-type well 32 of n-type mono-crystalline semiconductor substrate 30. Source/drain regions 60, 62, 64 and 66, interconnect the devices 12, 14, 16 and 18 in series along the bit line. The source/drain regions 40, 60, 62, 64 and 66 are doped with a relatively light concentration of n-type dopant, indicated by "n⁻".

In one embodiment, select transistor 12 (as an amorphous poly-silicon ("poly") gate 44s (formed as further explained below) and separated from a channel region 70 between drain region 40 and source region 60 by an oxide layer 50 which may be, for example, 168 Å thick. Select transistor 12's poly gate 44s is covered by a thin tungsten silicide layer 58s.

Oxide layer 50 may be thermally grown using a dry oxidation process at about 1050°C. to a thickness of about 148 Å. A photoresist mask is then used to pattern for an etching step that exposes the substrate outside of the select transistors (e.g., select transistor 12). Then, a film of about 87 Å of oxide is formed as tunnel oxide 52 using a dry thermal oxidation process at bout 1050° C. Due to the slower growth rate on oxide layer 50, oxide layer 50 only increases about 20 Å to a thickness of about 168 Å.

A polysilicon layer 56 is then deposited as a doped amorphous polysilicon layer using an in situ chemical vapor deposition ("CVD") technique which reacts silane ($SiH_4$) at around 530° C. and 400 mT. Polysilicon layer 56, which subsequently provides floating gates 56m1, 56m2, 56m3, is insulated from the channel regions 72, 74, 76, respectively, by tunnel oxide layer 52. An oxide-nitride-oxide ("ONO") tri-layer 54, for subsequently providing insulators 54m1, 54m2, 54m3 of transistors 14, 16 and 18, is formed by a first HTO oxide deposition of about 50 Å of oxide at 750° C., followed by deposition at about 760° C. of a nitride ($Si_3 N_4$) layer of 80 Å, and a wet thermal nitride oxidation at about 950° C. by wet $O_2$, thus forming an oxide layer of about 45 Å thick.

Phosphorous doped polysilicon of about 1200 Å thick is then deposited, using silane at about 530° C. and at about 400 mT of pressure, for subsequently forming control gates 44s, 446m1, 44m2, 44m3 of transistors 12, 14, 16, and 18. A 1400 Å tungsten silicide (Wsix) layer 58, for subsequently forming tungsten silicide layers 58s, 586m1, 58m2, 58m3 of transistors 12, 14 and 18, is then deposited by CVD using a mixture of $WF_6$ gas and silane gas. Patterning using photoresist and subsequent etching steps provide control gates 44s, 446m1, 44m2, 44m3, ONO structures 526m1, 52m2 and 52m3, and floating gates 56m1, 56m2 and 56m3 for the transistors shown.

A retrograde distribution of dopant is then introduced by ion implantation into the channel regions 72, 74 and 76, while channel region 70 under select transistor 12 is masked by photoresist. The retrograde distribution of dopant is accomplished by implanting an n-type dopant (e.g., arsenic) at a tilt implant angle of, for example, 45° to vertical. Other tilt angles may also be suitable. The implantation can be made with a "batch-type" machine or with a single-wafer machine. In a batch-type machine, the wafer is rotated during the tilt implantation process. In a single-wafer machine, the implantation is done with a zero degree twist and a 180 degree twist (i.e., a tilt implantation through one side of source/drain regions 60, 62, and 64, followed by a like tilt angle implantation deposition through the source/drain regions 62, 64 and 66). Implantation energies between 80 and 110 KeV are suitable, forming resulting dopant concentrations of about $2 \times 10-12$ to $8 \times 10-13$ atoms per $cm^2$.

In a batch-type machine, the resulting dopant concentration is generally a frusto-conical distribution at region 80 axially displaced about a target area in the p-type well 32 beneath channel regions 72, 74, 76. In a single-wafer machine, region 80 extends in the channel region parallel to the bit line on each side of the centerline of each channel. After an annealing step, region 80 has a dopant distribution that increases from the level in the substrate closest to the tunnel oxide 52 to the level of the target area and then decreases down through the substrate. In addition, region 80 has a lateral distribution which tends to be highest toward the centerline axis around the target area, and decreases in the direction toward opposing source/drain regions (e.g., source/drain regions 60 and 62 for transistor 14, source/drain regions 62 and 64 for transistor 16).

The retrograde dopant distribution in the channel provides additional carriers (e.g., electrons in the case of an NMOS device) in the channel and decreases the series channel resistance, so that transistors 14, 16 and 18 operate in a manner similar to NMOS buried channel devices.

The present invention has been described in general terms to allow those skilled in the art to understand and utilize the invention, and in relation to a specific embodiment. The present invention is not limited to the preferred embodiment, and may be modified in a number of ways within the scope of the present invention. For example the specific materials and layers of the gate structures of the isolated gate floating gate MOS transistors may be modified. Other dopants may be added to modify the profiles and concentrations of the source/drain regions and the p-well in addition to those described herein.

We claim:

1. A memory array comprising:
    a plurality of floating gate transistors connected in series, each floating gate transistor having formed, in a well of a substrate,
    a source and a drain region and
    a channel region separating said source and drain regions,
    a dopant concentration region displaced about a target region, said target region situated below said channel region, said dopant concentration region extending into said channel region such that said channel region has a non-uniform concentration of dopant;
    wherein said well has a first conductivity type, said source and said drain regions have a second conductivity type, and said dopant concentration region has said second conductivity type.

2. The memory array of claim 1 wherein said dopant concentration region is formed by a tilted ion implantation utilizing as a mask, at least a part of a gate structure of each floating gate transistor.

3. A transistor comprising:
    in a well structure of a substrate, a source and a drain region and a channel region separating said source and said regions, a dopant concentration region displaced about a target region, said target region situated below said channel region, said dopant concentration region extending into said channel region such that said channel region has a non-uniform concentration of dopant;
    wherein said well structure has a first conductivity type, said source and said drain regions have a second conductivity type, and said dopant concentration region has said second conductivity type.

4. The transistor of claim 3 wherein said dopant concentration region is provided by a tilted ion implantation utilizing as a mask, at least part of a gate structure of said transistor.

5. The transistor of claim 3, wherein the transistor is an NMOS transistor.

6. The NMOS transistor of claim 5, wherein the NMOS transistor is a floating gate transistor.

* * * * *